(12) United States Patent
Pan et al.

(10) Patent No.: US 12,384,914 B2
(45) Date of Patent: *Aug. 12, 2025

(54) POLYMERS FOR PHOTOVOLTAIC APPLICATIONS

(71) Applicant: PHILLIPS 66 COMPANY, Houston, TX (US)

(72) Inventors: Hualong Pan, Bartlesville, OK (US); Laura Nielsen, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 524 days.

This patent is subject to a terminal disclaimer.

(21) Appl. No.: 17/726,802

(22) Filed: Apr. 22, 2022

(65) Prior Publication Data
US 2022/0359827 A1    Nov. 10, 2022

Related U.S. Application Data

(60) Provisional application No. 63/178,618, filed on Apr. 23, 2021.

(51) Int. Cl.
*C08L 65/00* (2006.01)
*C08G 61/12* (2006.01)
(Continued)

(52) U.S. Cl.
CPC ............ *C08L 65/00* (2013.01); *C08G 61/126* (2013.01); *H10K 85/113* (2023.02);
(Continued)

(58) Field of Classification Search
CPC .... H10K 85/113; H10K 85/151; H10K 30/40; H10K 30/30; C08G 61/126;
(Continued)

(56) References Cited

U.S. PATENT DOCUMENTS

| | | | | |
|---|---|---|---|---|
| 2007/0228363 A1* | 10/2007 | Ong | ..................... | C08G 61/126 257/40 |
| 2013/0247990 A1* | 9/2013 | Facchetti | ............. | H10K 85/151 136/263 |
| 2018/0026194 A1* | 1/2018 | Earmme et al. | ..... | C08G 61/126 528/9 |

FOREIGN PATENT DOCUMENTS

DE        102009016502    *   4/2009   .......... H10K 85/657

OTHER PUBLICATIONS

Guo et al. (J. Mater. Chem. A, 2019, 7, 27394-274).*

* cited by examiner

*Primary Examiner* — Shane Fang
(74) *Attorney, Agent, or Firm* — Phillips 66 Company

(57) ABSTRACT

A method of combining different materials to produce the polymer

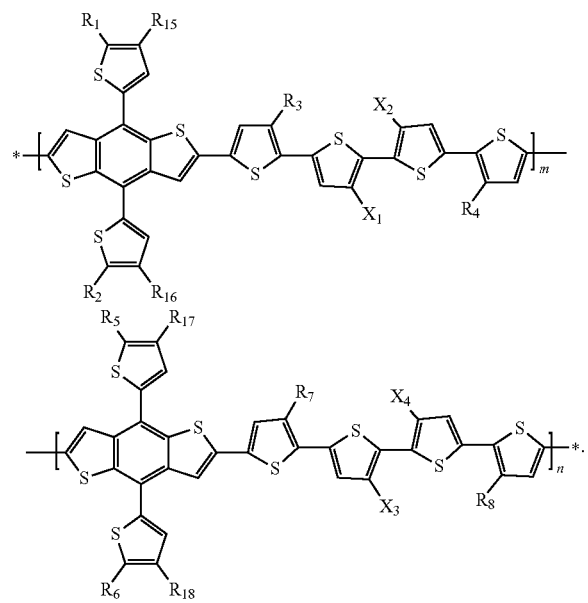

In this polymer $X_1$, $X_2$, $X_3$, and $X_4$ are independently selected from the group consisting of: F, Cl, H, and combinations thereof. Additionally, in this polymer $R_{15}$, $R_{16}$, $R_{17}$, and $R_{18}$ are independently selected from the group consisting of: F, Cl, H, and combinations thereof. Finally, in this polymer $R_1$, $R_2$, $R_3$, $R_4$, $R_5$, $R_6$, $R_7$, and $R_8$ are independently selected from unsubstituted branched alkyls with 1 to 60 carbon atoms unsubstituted or substituted (Continued)

CONVENTIONAL
DEVICE ARCHITECTURE

INVERTED
DEVICE ARCHITECTURE branched alkyls with 1 to 60 carbon atoms and unsubstituted or substituted linear alkyls with 1 to 60 carbon atoms.

7 Claims, 12 Drawing Sheets

(51) Int. Cl.
  *H10K 30/30* (2023.01)
  *H10K 30/40* (2023.01)
  *H10K 30/50* (2023.01)
  *H10K 85/10* (2023.01)
(52) U.S. Cl.
  CPC ..... *H10K 85/151* (2023.02); *C08G 2261/124* (2013.01); *C08G 2261/1412* (2013.01); *C08G 2261/149* (2013.01); *C08G 2261/18* (2013.01); *C08G 2261/228* (2013.01); *C08G 2261/3223* (2013.01); *C08G 2261/3243* (2013.01); *C08G 2261/91* (2013.01); *H10K 30/30* (2023.02); *H10K 30/40* (2023.02); *H10K 30/50* (2023.02)
(58) Field of Classification Search
  CPC ...... C08G 2261/124; C08G 2261/1412; C08G 2261/149; C08G 2261/18; C08G 2261/228; C08G 2261/3223; C08G 2261/3243; C08G 2261/91; C08G 75/06; C07D 513/14
  See application file for complete search history.

POLYMERS FOR PHOTOVOLTAIC APPLICATIONS

CROSS-REFERENCE TO RELATED APPLICATIONS

This application is a non-provisional application which claims the benefit of and priority to U.S. Provisional Application Ser. No. 63/178,618 filed Apr. 23, 2021, entitled "Polymers for Photovoltaic Applications," which is hereby incorporated by reference in its entirety.

STATEMENT REGARDING FEDERALLY SPONSORED RESEARCH OR DEVELOPMENT

None.

FIELD OF THE INVENTION

This invention relates to polymers for organic photovoltaics.

BACKGROUND OF THE INVENTION

Solar energy using photovoltaics requires active semiconducting materials to convert light into electricity. Currently, solar cells based on silicon are the dominating technology due to their high power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light-weight, economical in the materials used, and can be deposited on low cost substrates, such as flexible plastic foils. However, organic photovoltaic devices typically have relatively low power conversion efficiency (the ratio of incident photons to energy generated) and poor film forming ability.

There exists a need for a polymer to create organic photovoltaic cells that has high solution extinction coefficients, superior film forming ability and high photovoltaic performance.

BRIEF SUMMARY OF THE DISCLOSURE

A method of combining

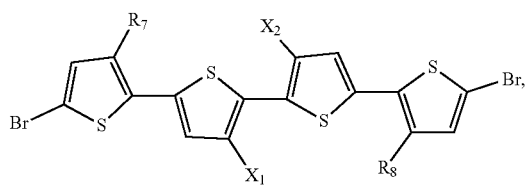

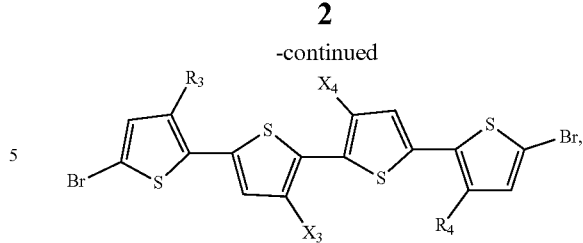

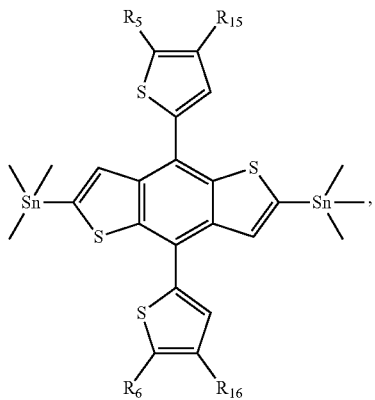

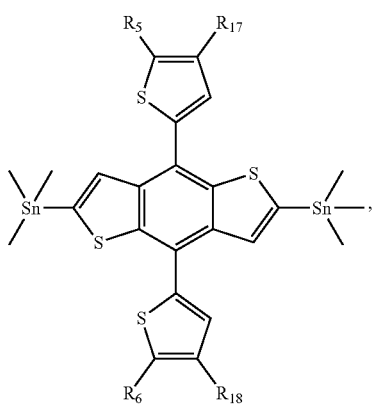

tris(dibenzylideneacetone)dipalladium(0), tris(o-tolyl)phosphine, and anhydrous chlorobenzene to produce a solution. The solution is then purified and dried to produce

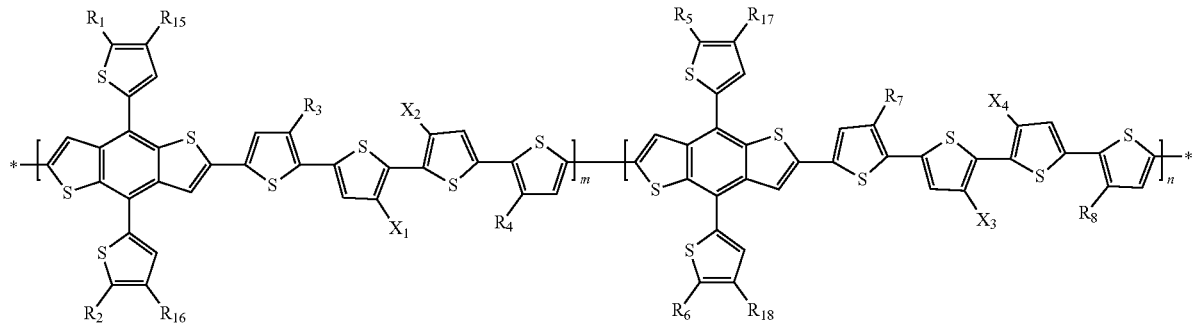

wherein n+m=1. In this polymer $X_1$, $X_2$, $X_3$, and $X_4$ are independently selected from the group consisting of: F, Cl, H, and combinations thereof. Additionally, in this polymer $R_{15}$, $R_{16}$, $R_{17}$, and $R_{18}$ are independently selected from the group consisting of: F, Cl, H, and combinations thereof. Finally, in this polymer $R_1$, $R_2$, $R_3$, $R_4$, $R_5$, $R_6$, $R_7$, and $R_8$ are independently selected from unsubstituted or substituted branched alkyls with 1 to 60 carbon atoms and unsubstituted or substituted linear alkyls with 1 to 60 carbon atoms.

A method is also taught of combining

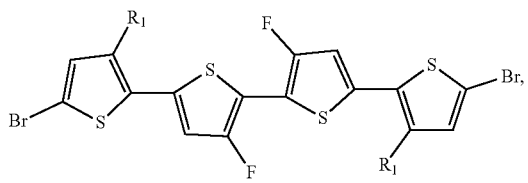

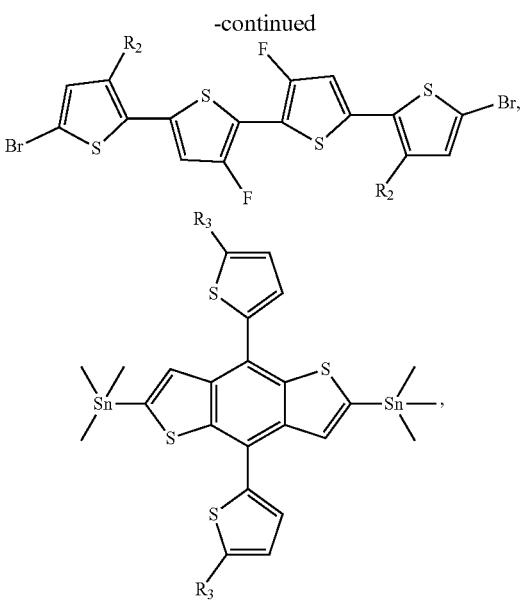

tris(dibenzylideneacetone)dipalladium(0), tris(o-tolyl)phosphine, and anhydrous chlorobenzene to produce a solution. The solution is purified and dried to produce

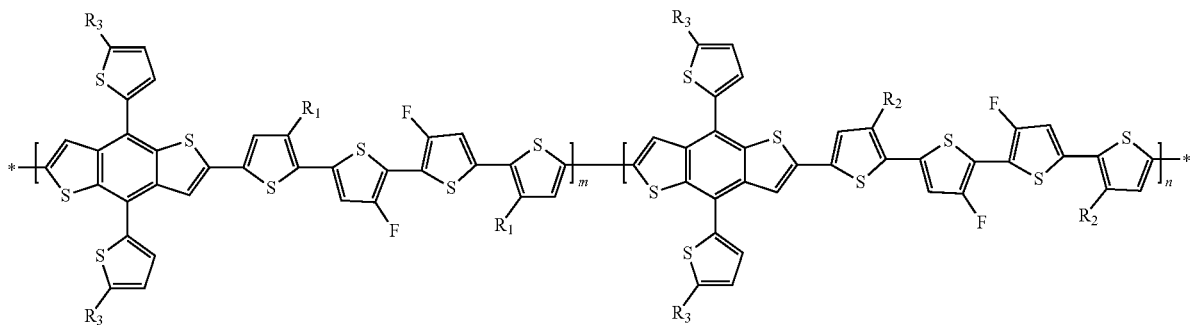

wherein n+m=1. In this polymer $R_1$, $R_2$, and $R_3$ are independently selected from unsubstituted or substituted branched alkyls with 1 to 60 carbon atoms and unsubstituted or substituted linear alkyls with 1 to 60 carbon atoms.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Figure 1:
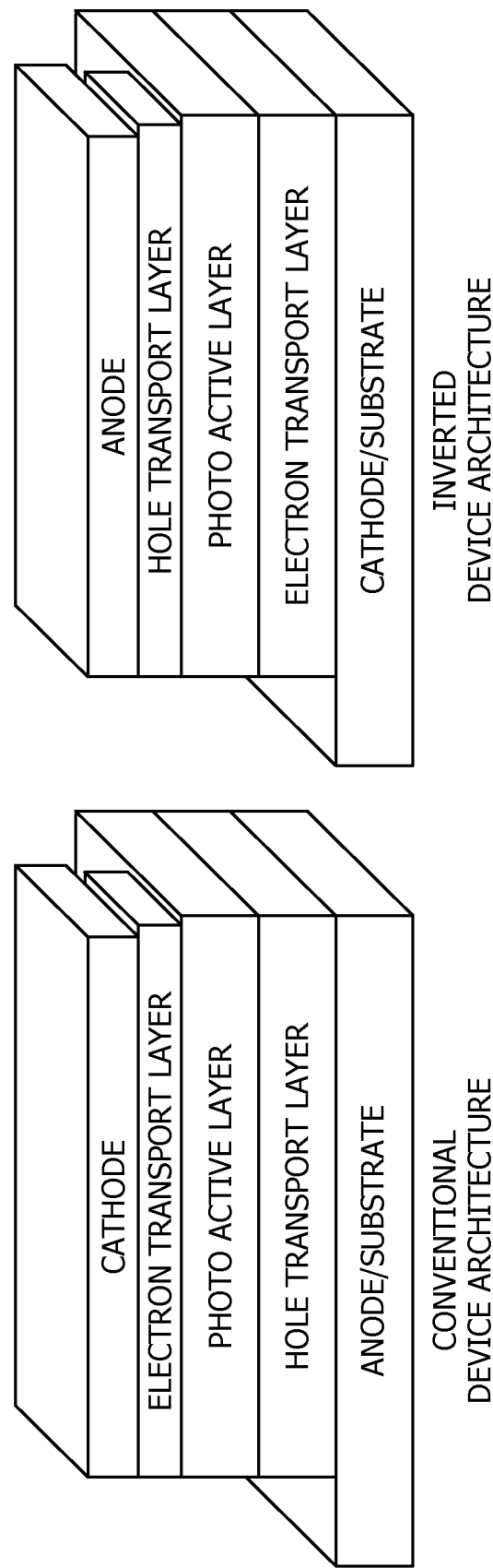
FIG. 1 depicts a conventional device architecture and an inverted device architecture.

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, and includes straight and branched chained, single, double and triple bonded carbons such as methyl, ethyl, n-propyl, isopropyl, n-butyl, isobutyl, sec-butyl, t-butyl, n-pentyl, isopentyl, neo-pentyl, n-hexyl, isohexyl, thenyl, propenyl, butenyl, pentenyl, hexenyl, butadienyl, pentadienyl, hexadienyl, ethynyl, propynyl, butynyl, pentynyl, hexynyl, 2-ethylhexyl, 2-butyloctyl, 2-hexyldecyl, 2-octyldedodecyl, 2-decyltetradecy and the like. In this application alkyl groups can include the possibility of substituted and unsubstituted alkyl groups. Substituted alkyl groups can include one or more halogen substituents.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 3 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups. As used herein aryl groups also include heteroaryls, including structures with more than one heteroatom. Non-limiting examples of heteroatoms that can be heteroaryls include B, N, O, Al, Si, P, S, Ge, Bi, Te, Sn, and Se. Some non-limiting examples of aryl groups with heteroaryls include: thiophene, pyridine, pyrrole, furan, stibole, arsole selenophene, imidazole, pyrazole, oxathiole, isoxathiole, thiazole, triazole, thiadiazole, diazine, oxazine, indole, and thiazine.

"Ester", as used herein, represents a group of formula —COOR wherein R represents an "alkyl", "aryl", a "heterocycloalkyl" or "heteroaryl" moiety, or the same substituted as defined above "Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and an anode to collect holes. The inverted device also has the photo-active layer and additional charge transport layers sandwiched in between two electrodes. FIG. 1 depicts a conventional device architecture and an inverted device architecture.

Polymer

In one embodiment the polymer can comprise

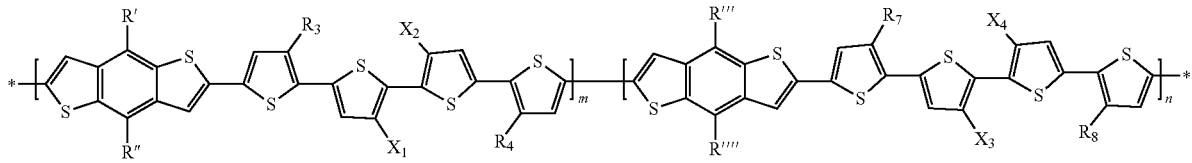

wherein m+n=1.

In this embodiment, R', R", R''', and R'''' can be independently selected from an alkyl group, an aryl group, an alkoxy group, a thioalkoxy group, or combinations thereof. In another embodiment, R', R", R''', and R'''' are independently selected from the group selected from:

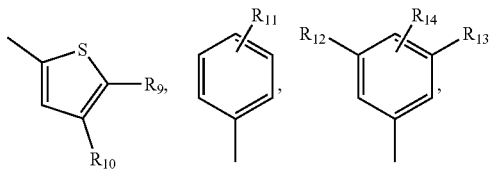

or combinations thereof, wherein $R_9$, $R_{10}$, $R_{11}$, $R_{12}$, $R_{13}$, and $R_{14}$ are independently selected from F, Cl, H, an alkyl group, an aryl group, an alkoxy group, a thioalkoxy group, or combinations thereof.

In another embodiment the polymer can comprise:

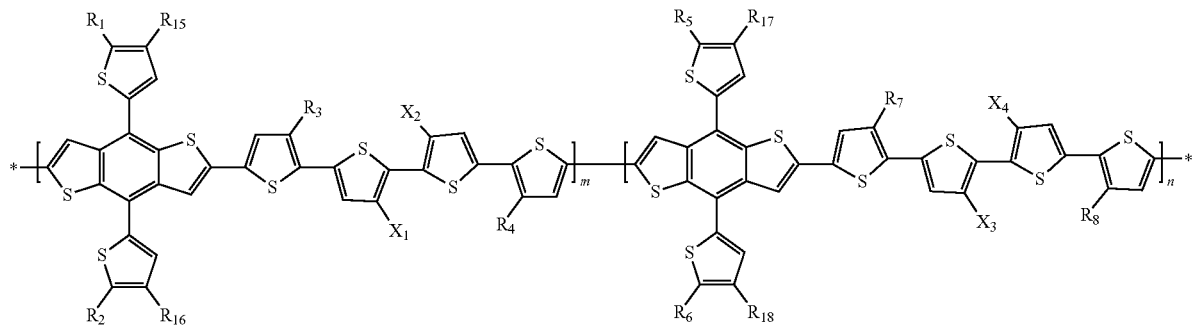

wherein m+n=1

In one embodiment, $R_1$, $R_2$, $R_3$, $R_4$, $R_5$, $R_6$, $R_7$, and $R_8$ are independently selected from substituted, unsubstituted, straight-chain, branched, or cyclic alkyls ranging from 1 to 100 carbon atoms. In another embodiment, they can be selected from 1 to 60 carbon atoms. In yet another embodiment, $R_1$, $R_2$, $R_5$, and $R_6$, can be identical; or $R_3$, and $R_4$, are identical; or even $R_7$, and $R_8$, are identical.

In one non-limiting example alkyl groups can include 2-ethyl-hexyl, 2-butyl-octyl, 2-hexyl-decyl, and 2-octyl-dodecyl.

In one embodiment, $R_{15}$, $R_{16}$, $R_{17}$, and $R_{18}$ can be independently selected from H, Cl, or F. In some embodiments, $R_{15}$ and $R_{16}$ can be the same as $R_{17}$ and $R_{18}$. In other embodiments $R_{15}$ and $R_{16}$ are different than $R_{17}$ and $R_{18}$.

In yet another embodiment, $X_1$, $X_2$, $X_3$, and $X_4$ are independently selected from the group consisting of: F, Cl, H, and combinations thereof.

In yet another feature of this embodiment, the number of monomer repeat units in the polymer can range from about 1 to about 100,000 repeat units. In other features of this embodiment, the number of monomer repeat units in this polymer can range from about 10 to about 75,000 repeat units, about 100 to about 50,000 repeat units or even from about 1,000 to about 20,000 repeat units. Additionally, in this polymer n+m=1 or alternatively, m=0.3 to 0.5 and n=0.5 to 0.7 or even, m=0.4 and n=0.6.

It is also envisioned that this polymer can be regio-regular or regio-random. It is also envisioned that the polymer can be used as a photovoltaic material or as an active layer in an electronic device.

In yet another embodiment, the polymer can comprise:

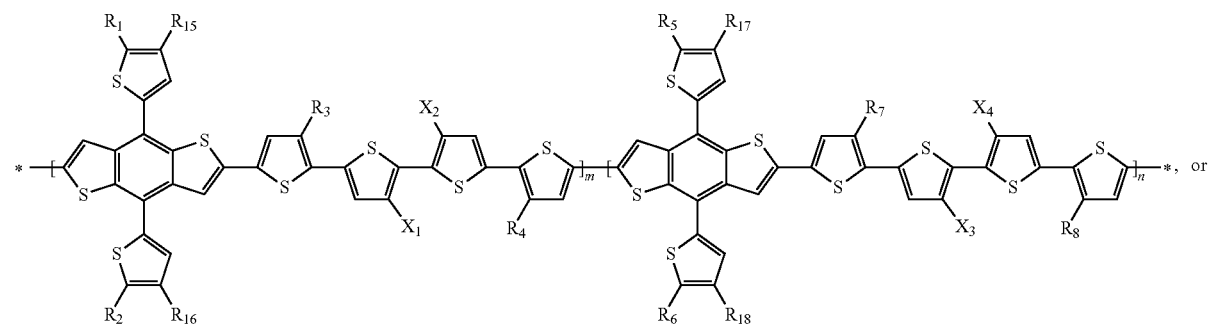

, or

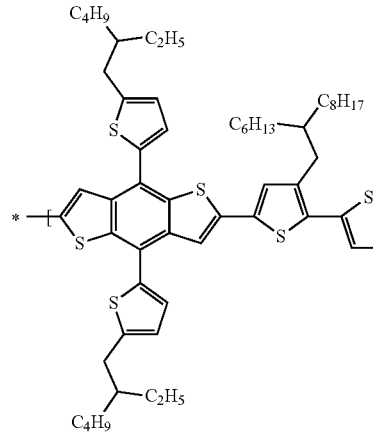
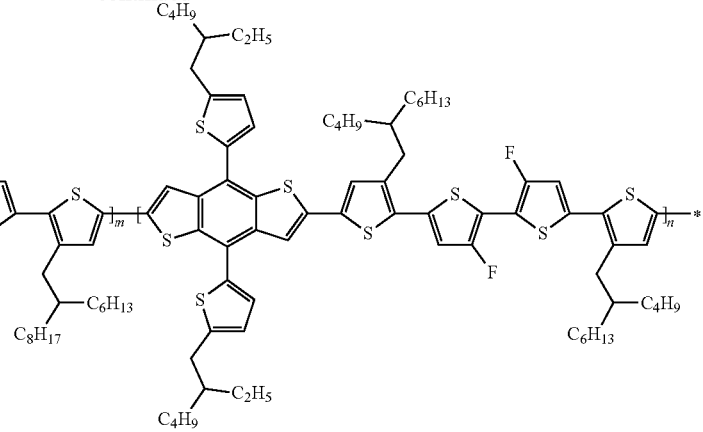

Monomer Synthesis

A method of combining

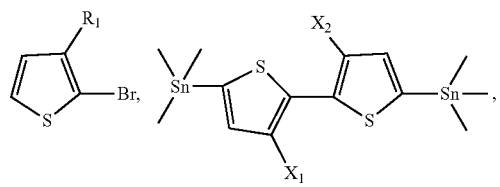

tris(dibenzylideneacetone)dipalladium(0), and tris(o-tolyl) phosphine to produce

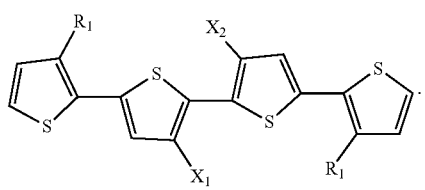

This is then followed by combining

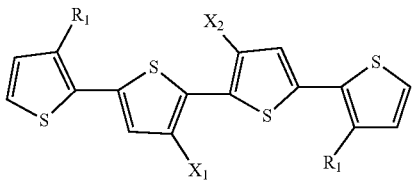

with n-bromosuccinimide and anhydrous tetrahydrofuran to produce the comonomer

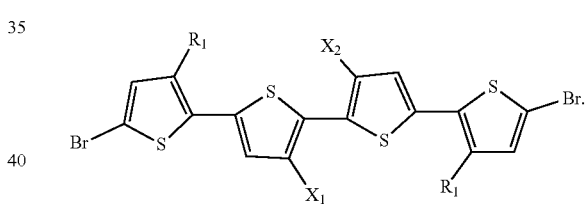

In this method $X_1$ and $X_2$ are independently selected from the group consisting of: F, Cl, H, and combinations thereof, and $R_1$ is independently selected from unsubstituted branched alkyls with 1 to 60 carbon atoms. In some embodiments, $X_1$ and $X_2$ are independently selected from the group consisting of: F, Cl, and H, wherein H can only be in $X_1$ or $X_2$ but not in both.

Through this process different repeat units can be made such as

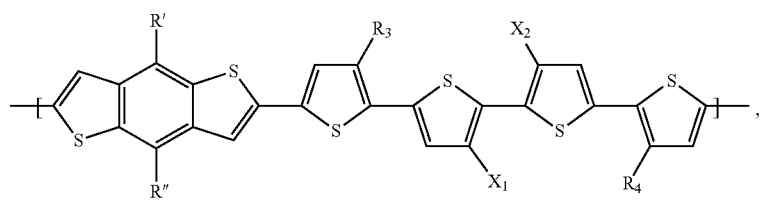

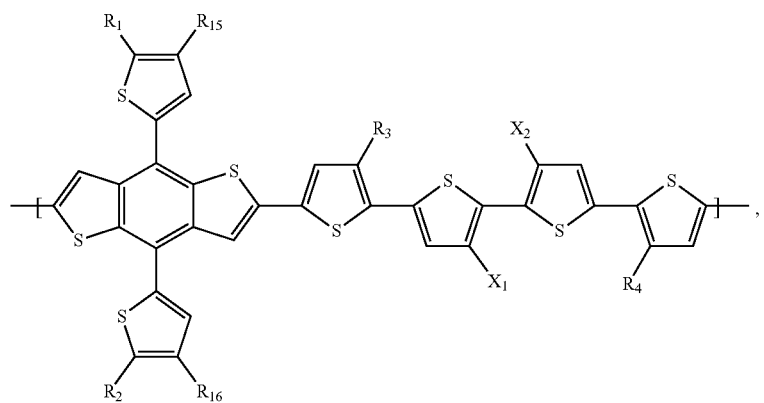
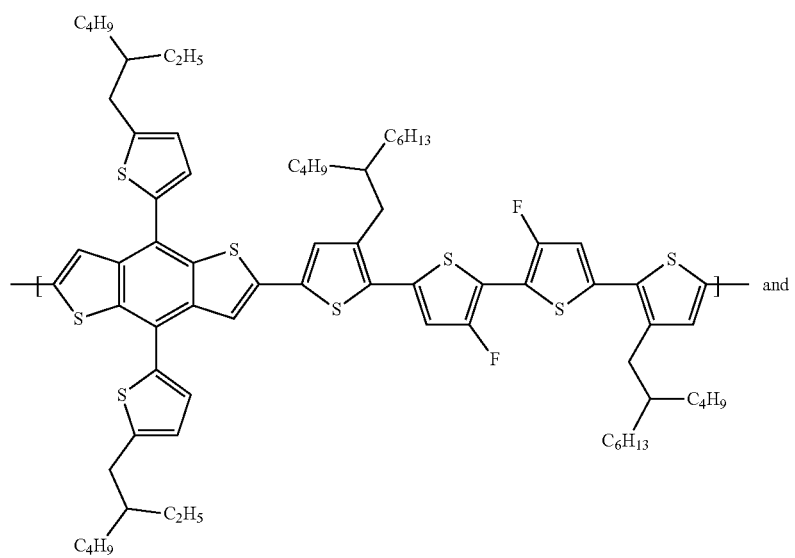
and
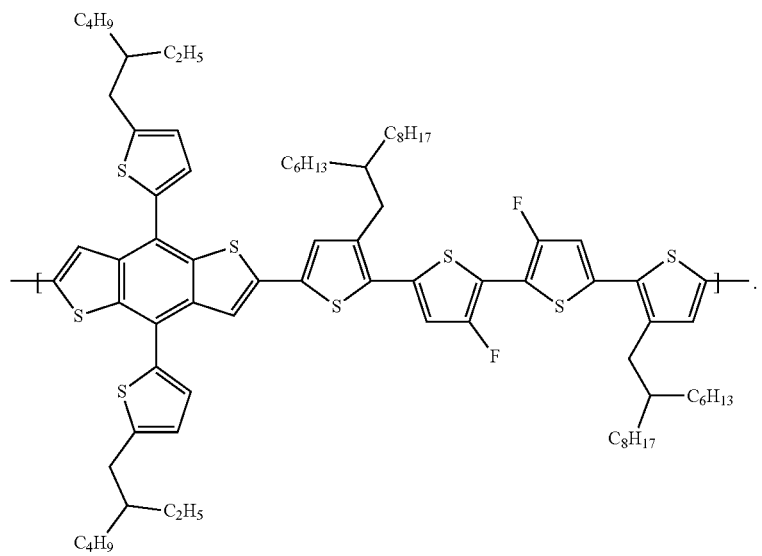
.

In these embodiments, $X_1$ and $X_2$ can be independently selected from the group consisting of F, Cl, H, and combinations thereof. R' and R" can be independently selected from an alkyl group, an aryl group, or combinations thereof. In other embodiments, R' and R" can be independently selected from the group selected from:

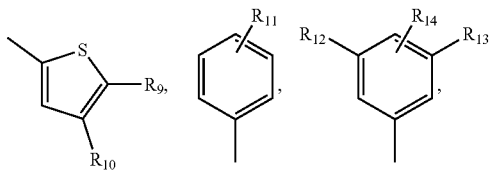

or combinations thereof, wherein R9, R10, R11, R12, R13, and R14 are independently selected from F, Cl, H, an alkyl group, an aryl group, or combinations thereof. Additionally, $R_1$, $R_2$, $R_3$, and $R_4$ can be independently selected from unsubstituted branched alkyls with 1 to 60 carbon atoms and unsubstituted linear alkyls with 1 to 60 carbon atoms. Additionally, $R_{15}$ and $R_{16}$ can be independently selected from H, F, Cl and combinations thereof.

In another embodiment, the monomer synthesis can be combining

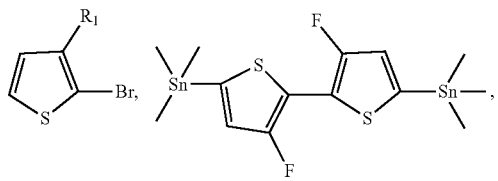

tris(dibenzylideneacetone)dipalladium(0), and tris(o-tolyl)phosphine to produce

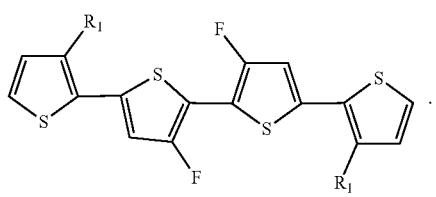

This is then followed by combining

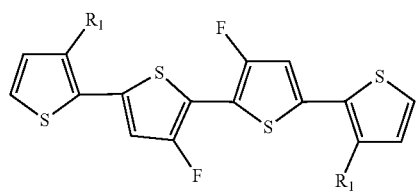

with n-bromosuccinimide and anhydrous tetrahydrofuran to produce the comonomer

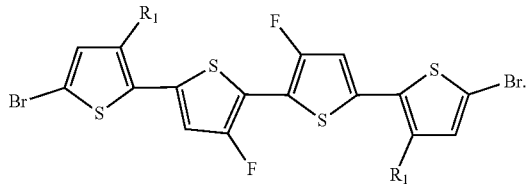

In this method $R_1$ is independently selected from unsubstituted branched alkyls with 1 to 60 carbon atoms.

In one embodiment, 2-bromo-3-(2-butyloctyl)thiophene, (3,3'-difluoro-[2,2'-bithiophene]-5,5'-diyl)bis(trimethylstannane), Pd2dba3, and P(o-tol)3 were combined. The mixture was degassed with argon twice before anhydrous toluene was added. The solution was then heated. After removal of solvent, the crude product was purified by column chromatography on silica gel using a mixture of dichloromethane and hexane as eluent to produce the following compound

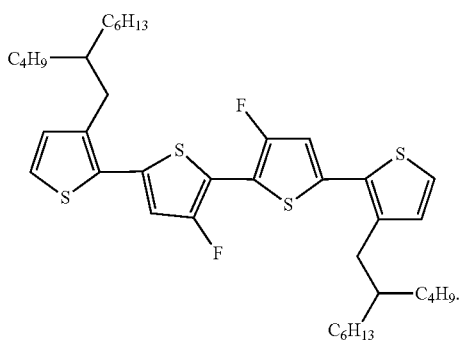

Figure 2:
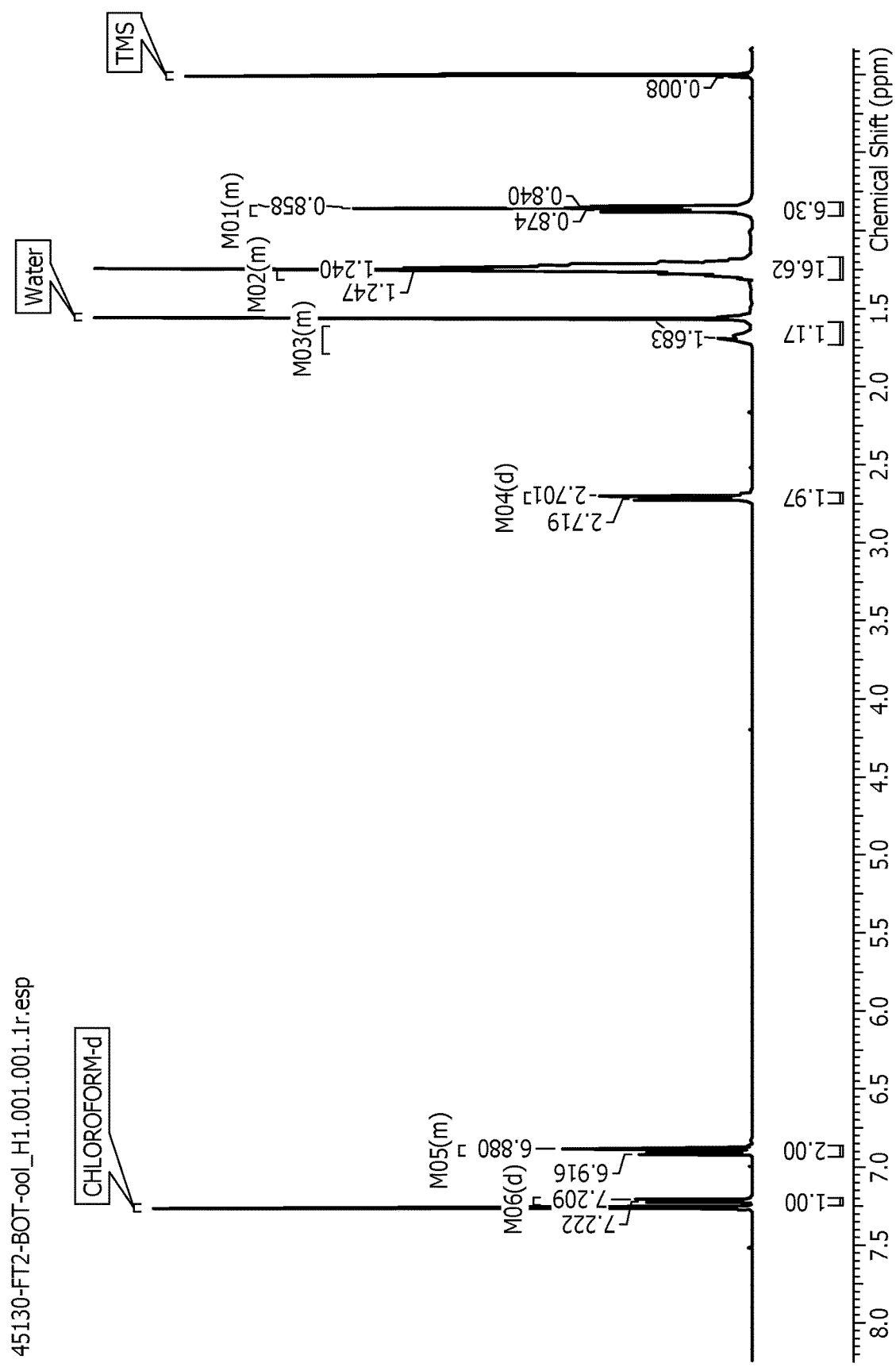
FIG. 2 depicts the H NMR of a compound.
Figure 3:
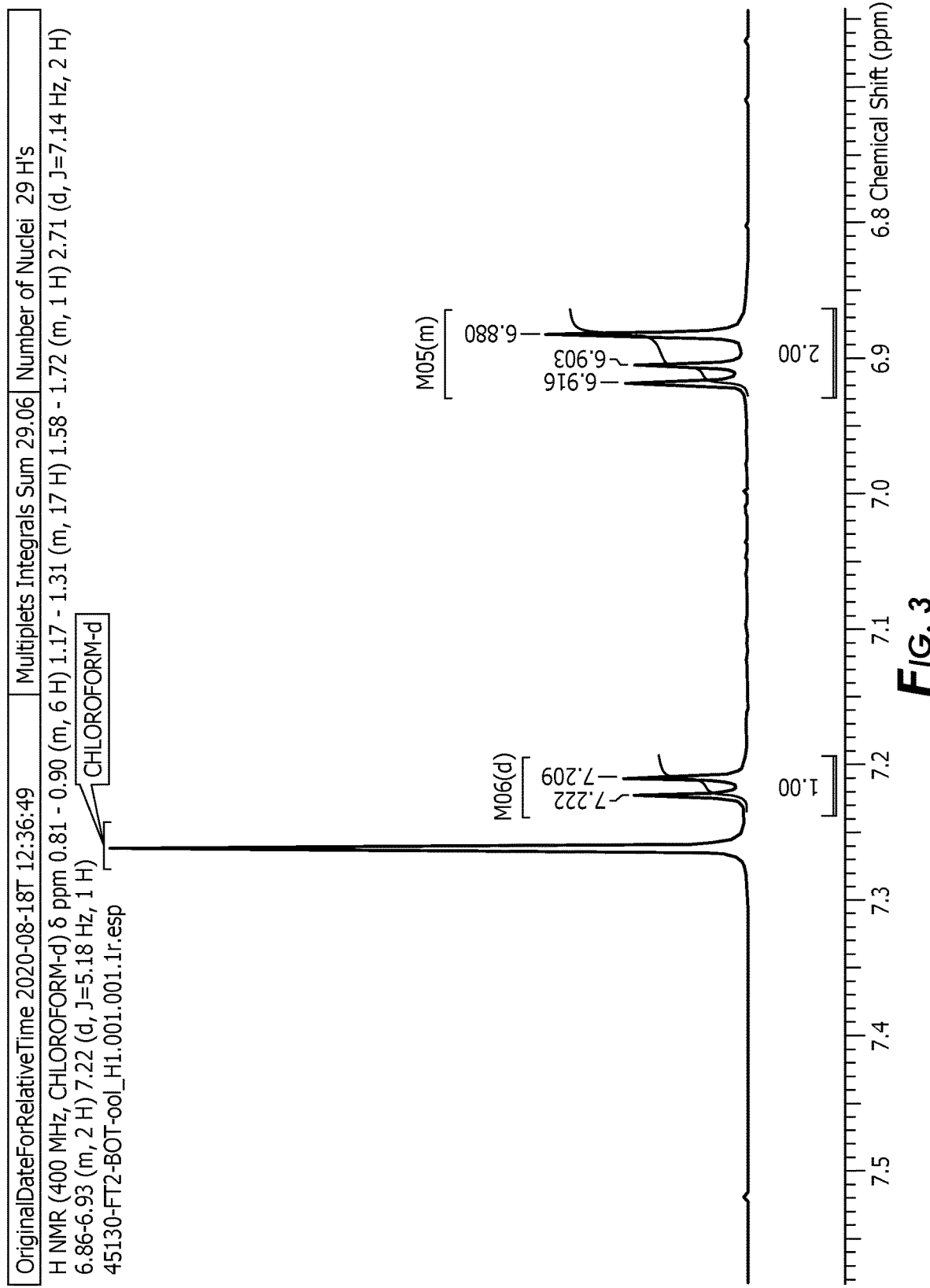
FIG. 3 depicts the H NMR of a compound.

The 1H NMR spectrum of the compound is shown in FIG. 2, with the enlarged aromatic region provided in FIG. 3.

The synthesis then continues by taking compound 3,3'''-bis(2-butyloctyl)-3'',4'-difluoro-2,2':5',2'':5'',2'''-quaterthiophene and adding anhydrous THF and N-bromosuccinimide. The reaction is then stirred and stopped by adding saturated potassium carbonate solution. After the removal of solvent, the resulting mixture was subjected to column purification to produce

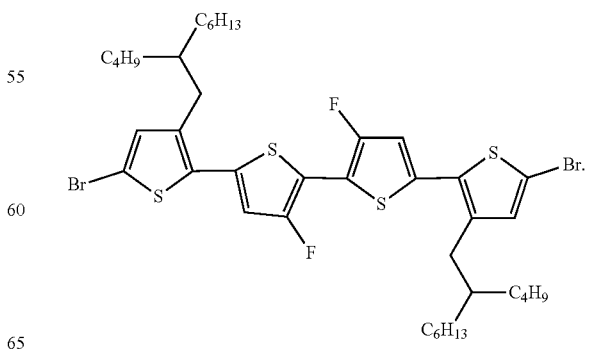

Figure 4:
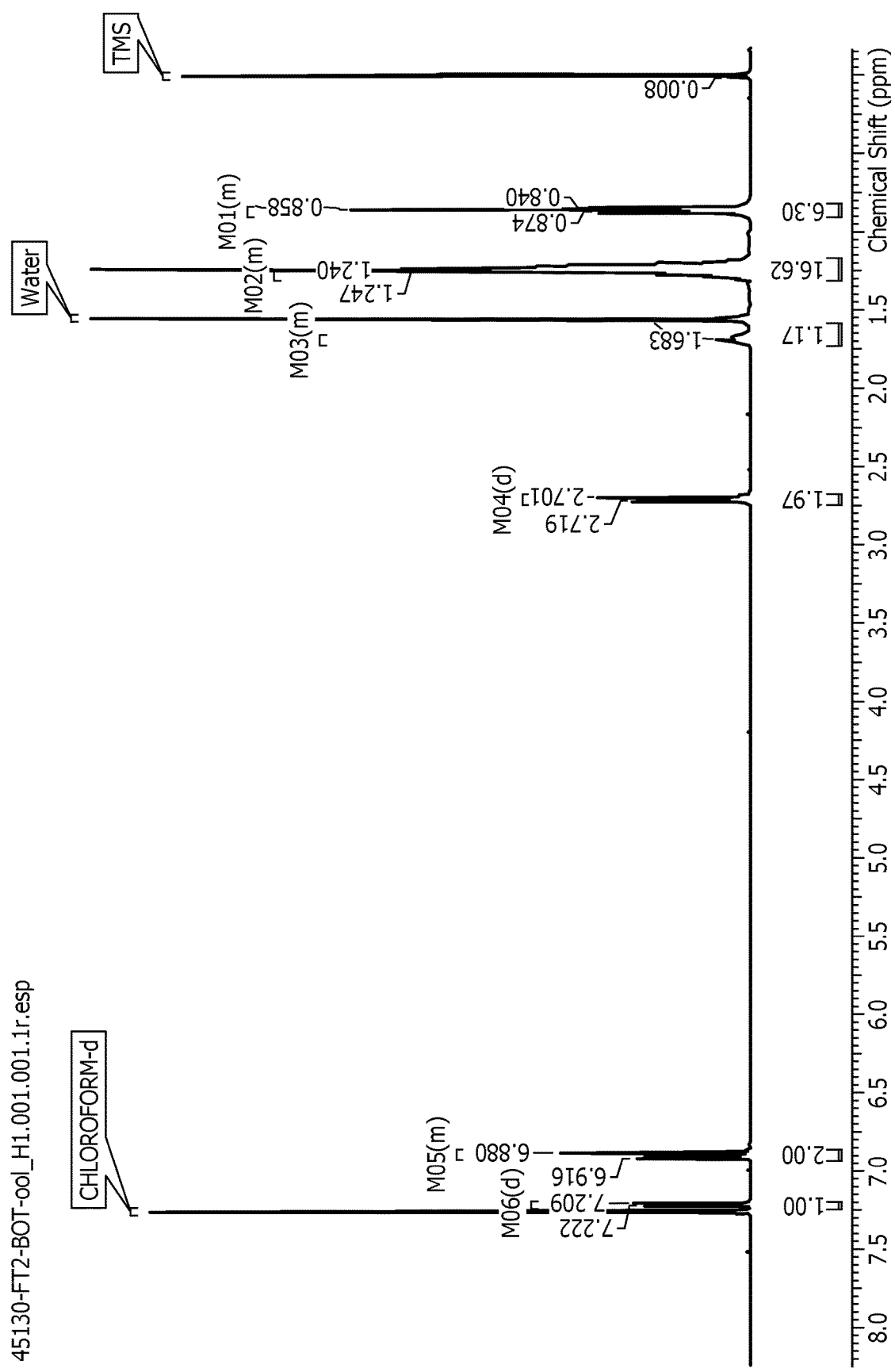
FIG. 4 depicts the H NMR of a compound.
Figure 5:
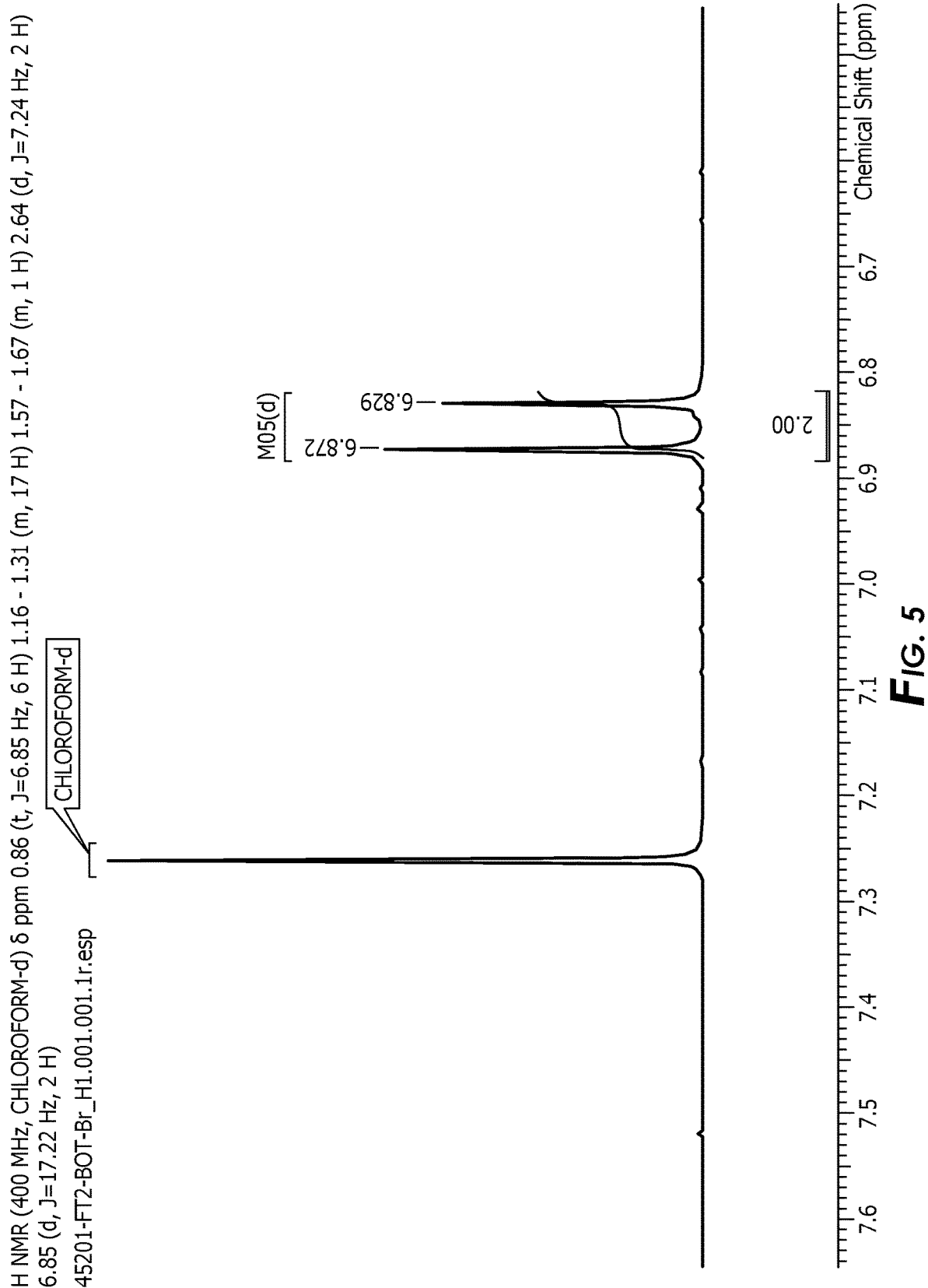
FIG. 5 depicts the H NMR of a compound.
Figure 6:
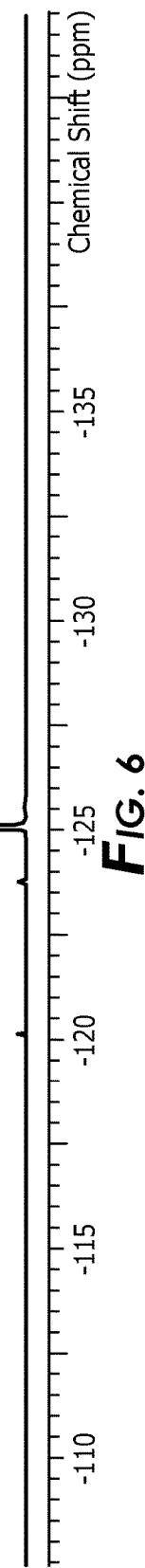
FIG. 6 depicts the F NMR of a compound.

The 1H NMR spectrum of the compound is shown in FIG. 4, with the enlarged aromatic region provided in FIG. 5. The F NMR spectrum is provided in FIG. 6.

In another embodiment, 2-bromo-3-(2-hexyldecyl)thiophene, (3,3'-difluoro-[2,2'-bithiophene]-5,5'-diyl)bis(trimethylstannane), Pd2dba3, and P(o-tol)3 were combined. The mixture was degassed with argon twice before anhydrous toluene was added. The solution was then heated. After removal of solvent, the crude product was purified by column chromatography on silica gel using a mixture of dichloromethane and hexane as eluent to produce the following compound

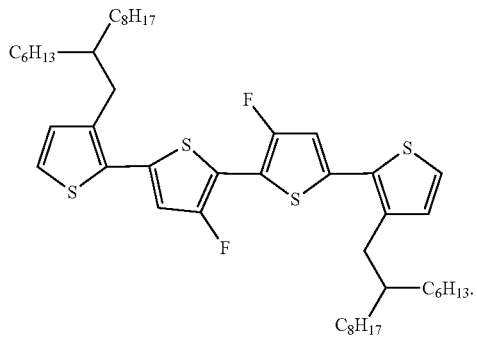

Figure 7:
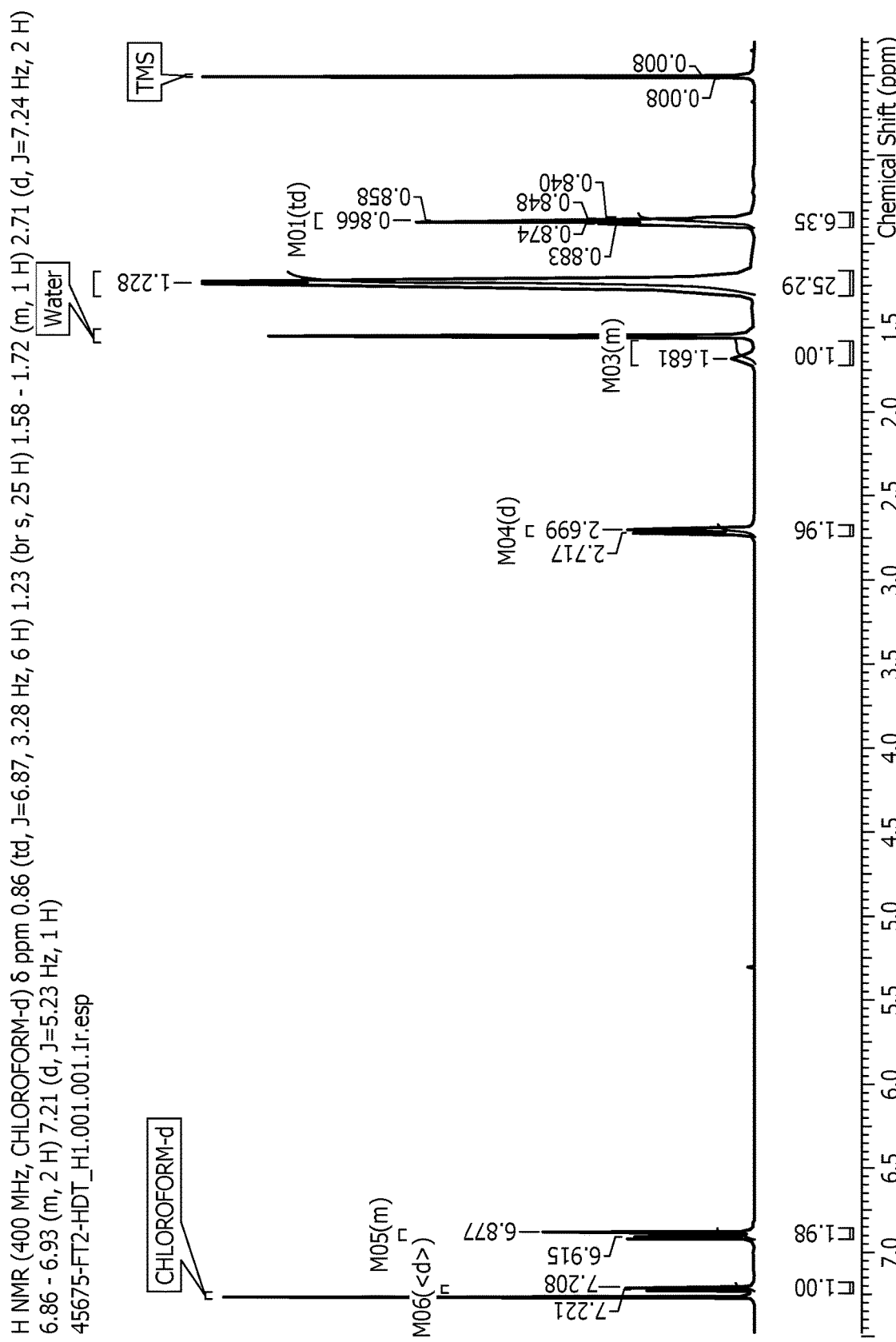
FIG. 7 depicts the H NMR of a compound.
Figure 8:
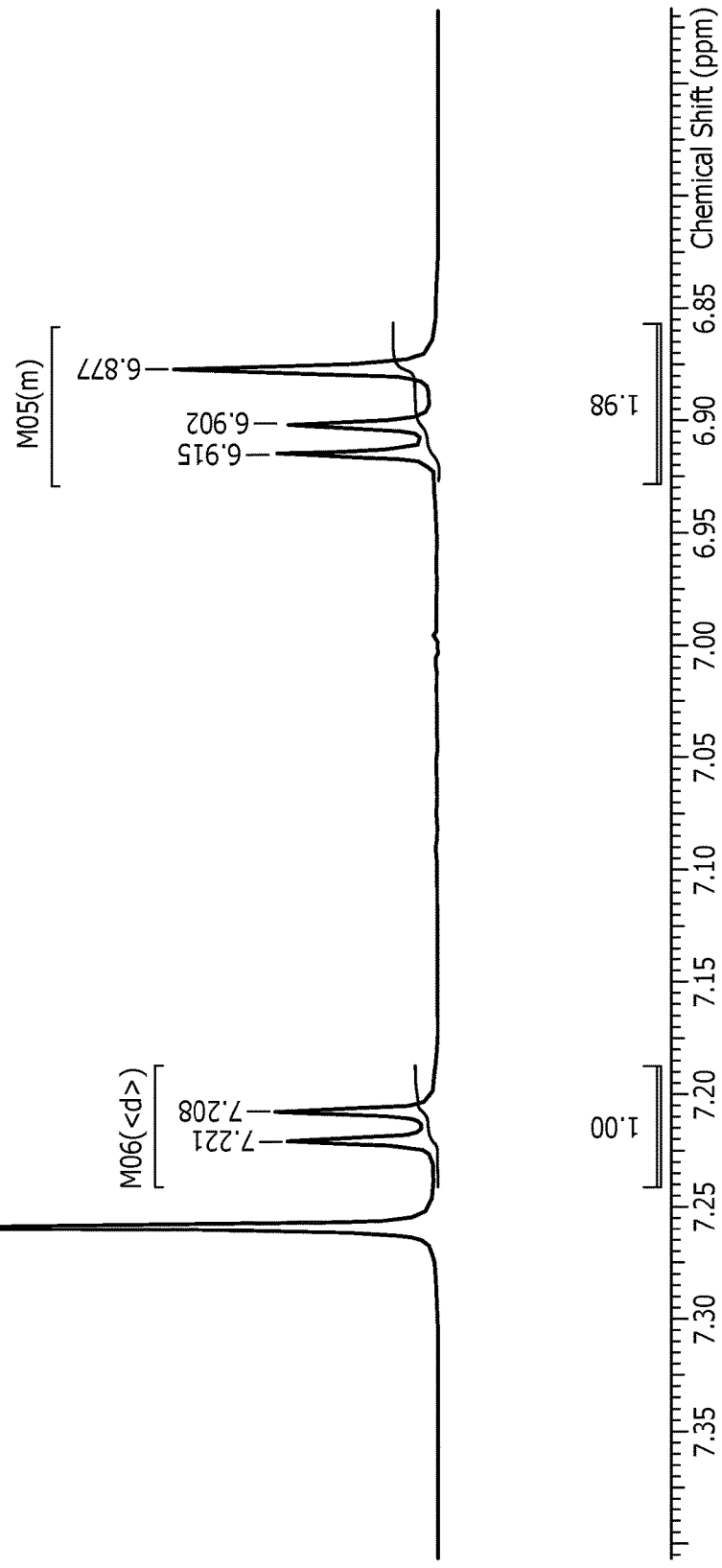
FIG. 8 depicts the H NMR of a compound.

The 1H NMR spectrum of the compound is shown in FIG. 7, with the enlarged aromatic region provided in FIG. 8.

The synthesis then continues by taking compound 3,3'''-bis(2-hexyldecyl)-3'',4'-difluoro-2,2':5',2'':5'',2'''-quaterthiophene and adding anhydrous THF and N-bromosuccinimide. The reaction is then stirred and stopped by adding saturated potassium carbonate solution. After the removal of solvent, the resulting mixture was subjected to column purification to produce

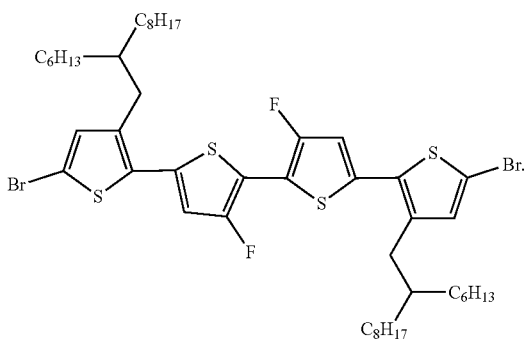

Figure 9:
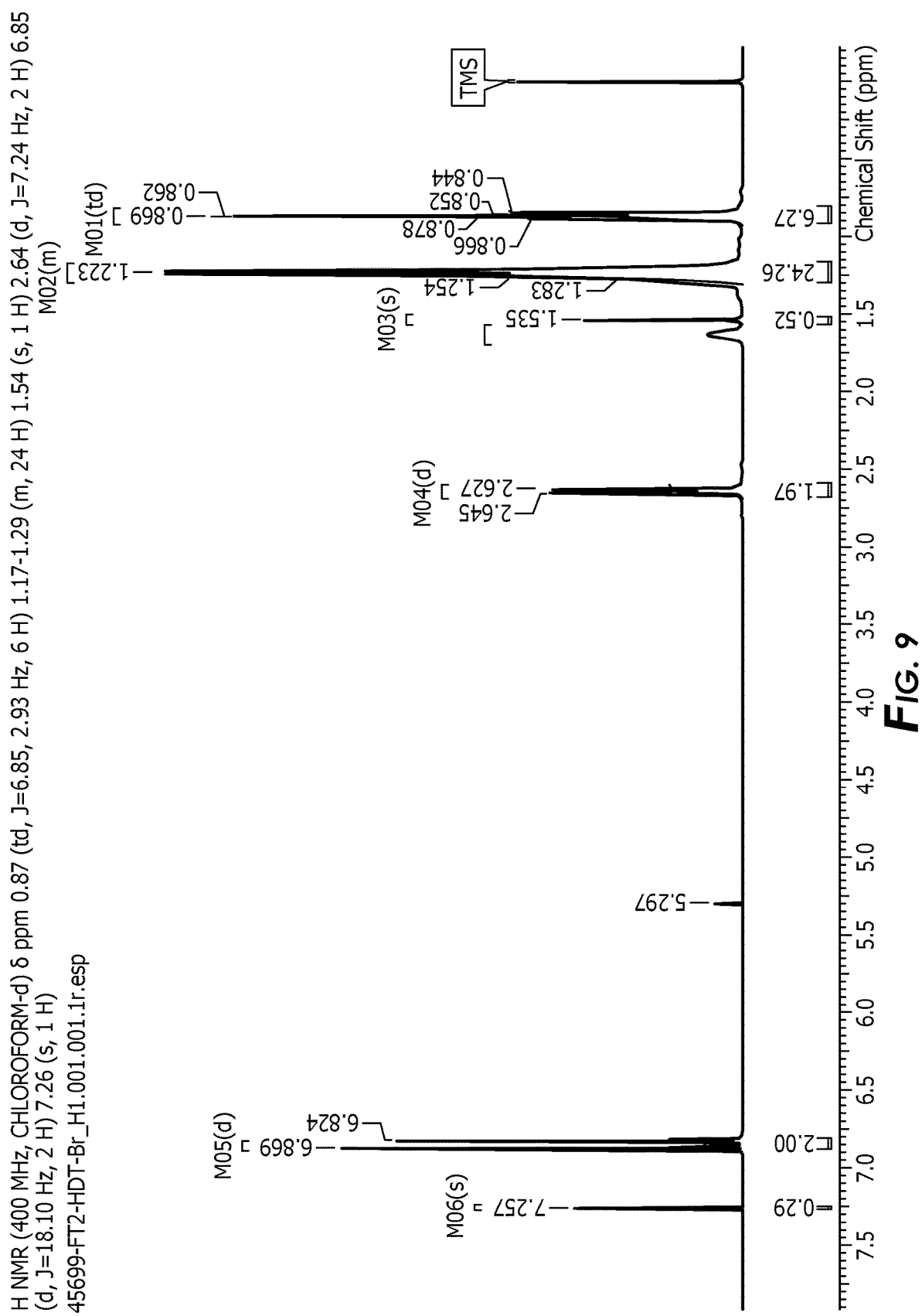
FIG. 9 depicts the H NMR of a compound.
Figure 10:
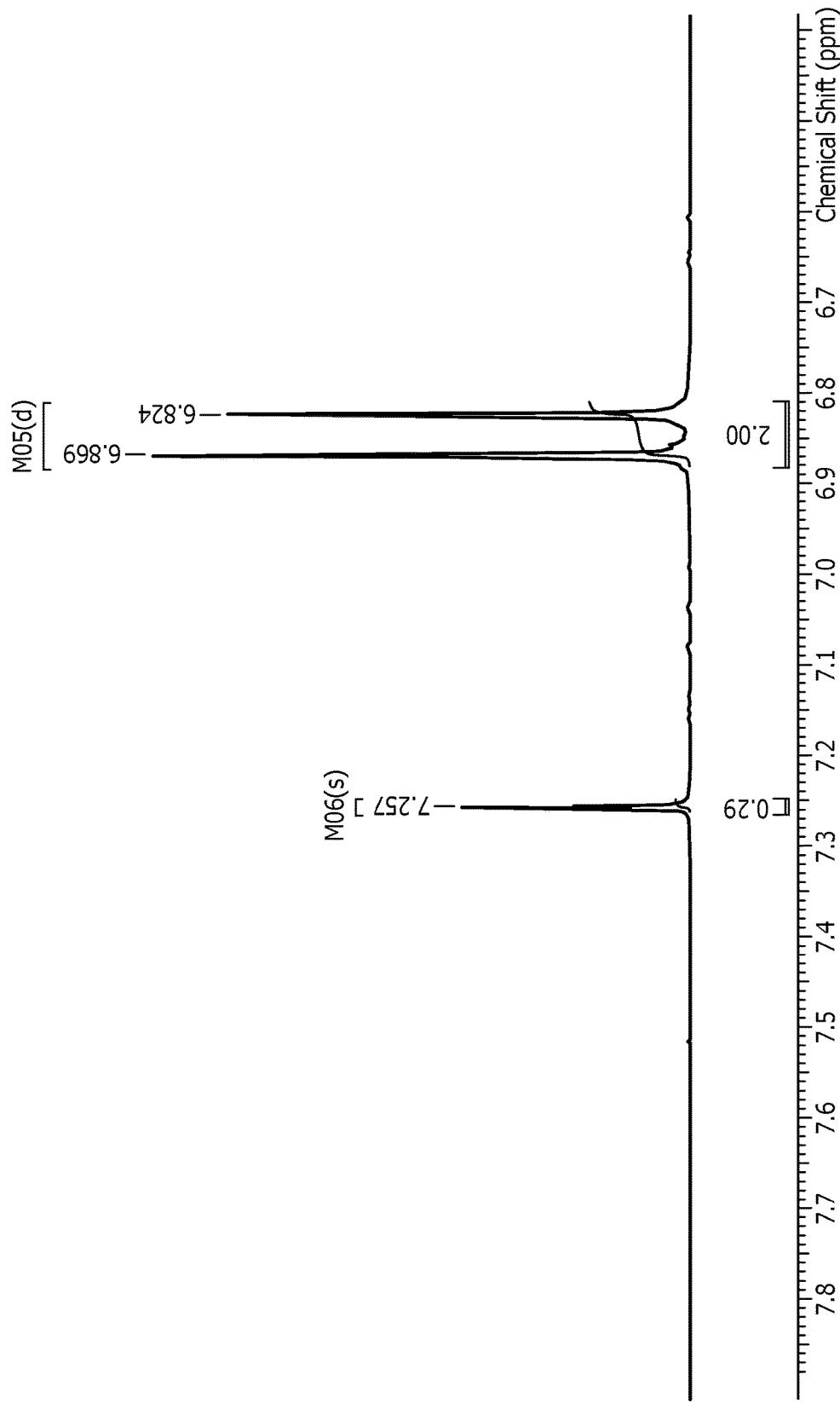
FIG. 10 depicts the H NMR of a compound.
Figure 11:
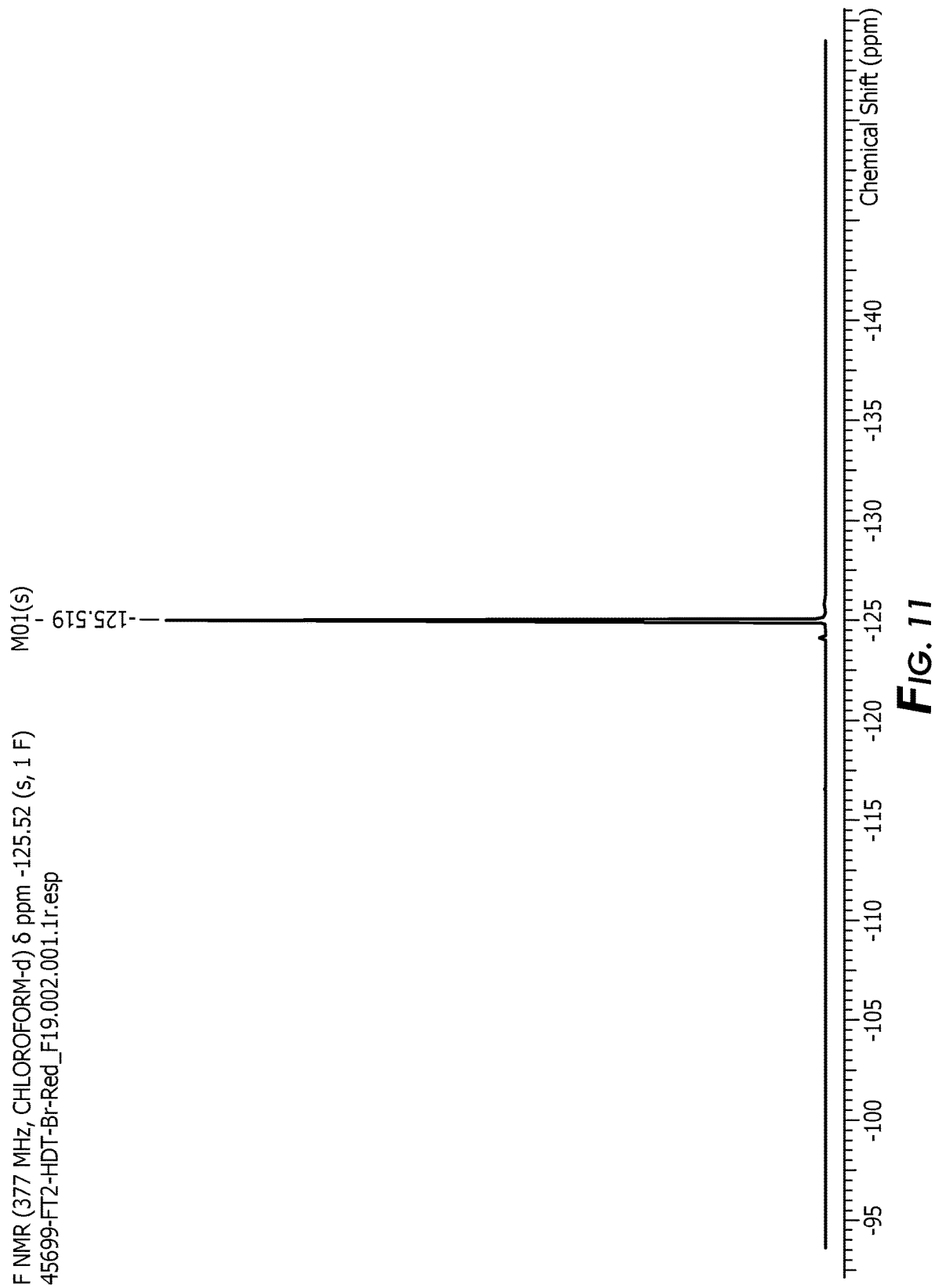
FIG. 11 depicts the F NMR of a compound.

The 1H NMR spectrum of the compound is shown in FIG. 9, with the enlarged aromatic region provided in FIG. 10. The F NMR spectrum is provided in FIG. 11.

Polymer Synthesis

The polymerization can be any conventionally known method of combining the monomers into a covalently bonded chain or network. In one non-limiting example the monomers can be polymerized using Stille cross coupling, Suzuki cross coupling or direct arylation polymerization.

In another embodiment, the polymerization can be performed by combining

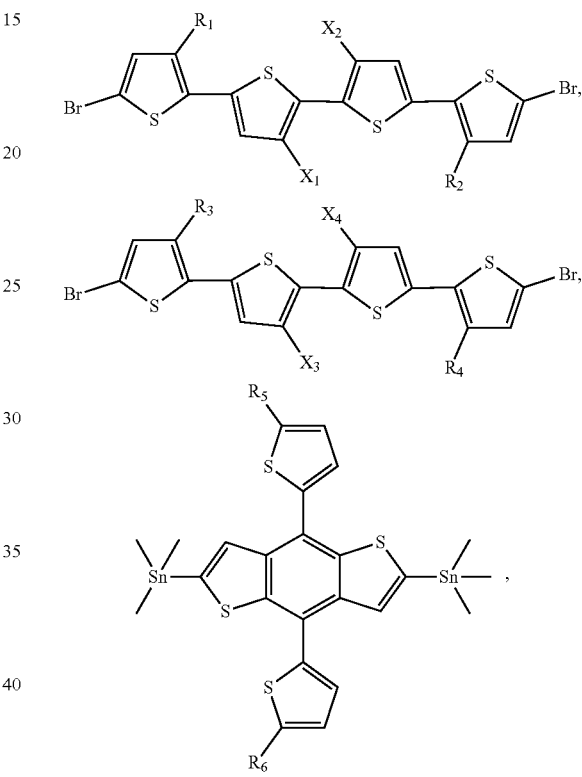

tris(dibenzylideneacetone)dipalladium(0), tris(o-tolyl)phosphine, and anhydrous chlorobenzene to produce a solution. The solution is then purified and dried to produce

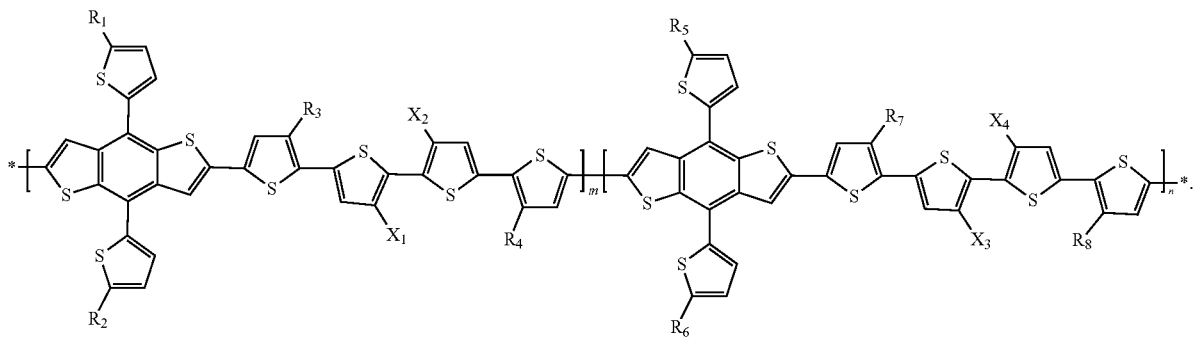

In this embodiment wherein n+m=1, and X1, X2, X3, and X4 are independently selected from the group consisting of: F, Cl, H, and combinations thereof. Additionally, in this embodiment, R1, R2, R3, R4, R5, R6, R7, and R8 are independently selected from unsubstituted branched alkyls with 1 to 60 carbon atoms. There are a variety of different permutations with this method such as X1 and X2 being identical; X3 and X4 being identical; $R_1$, $R_2$, $R_5$, and $R_6$ being identical; $R_3$ and $R_4$ being identical; and $R_7$ and $R_8$ being identical.

In yet another method involves combining

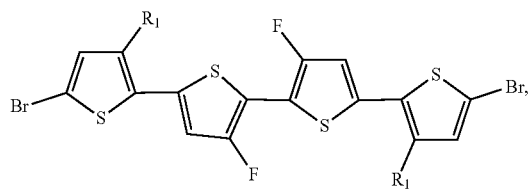

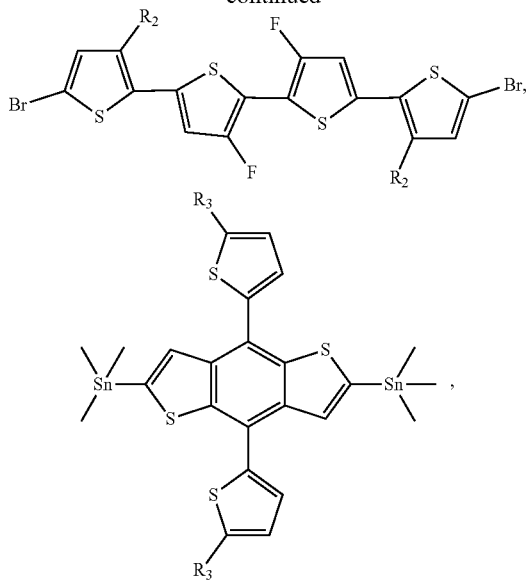

tris(dibenzylideneacetone)dipalladium(0), tris(o-tolyl)phosphine, and anhydrous chlorobenzene to produce a solution. The solution is then purified and dried to produce

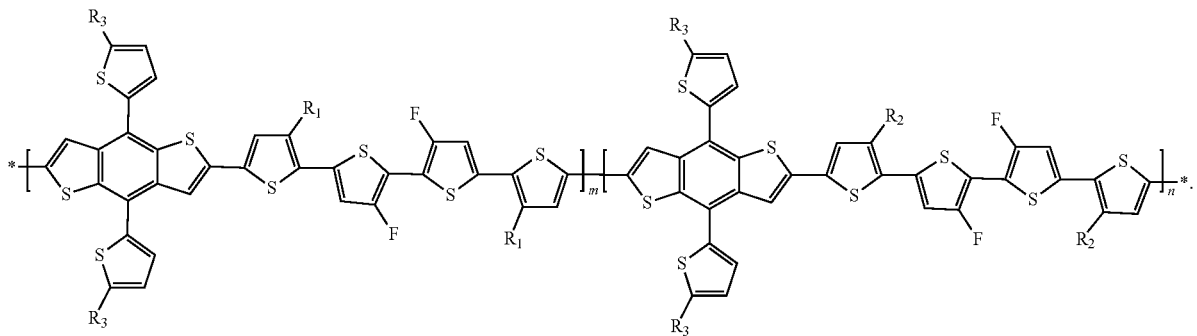

In this embodiment wherein n+m=1, and $R_1$, $R_2$, and $R_3$ are independently selected from unsubstituted branched alkyls with 1 to 60 carbon atoms.

Polymer A Synthesis

In yet another embodiment, the polymer synthesis can be compounds 5,5'''-dibromo-3,3'''-bis(2-butyloctyl)-3'',4'-difluoro-2,2':5',2'':5'',2'''-quaterthiophene, 5,5'''-dibromo-3,3'''-bis(2-hexyldecyl)-3'',4'-difluoro-2,2':5',2'':5'',2'''-quaterthiophene, (4,8-bis(5-(2-ethylhexyl)-thiophen-2-yl)benzo[1,2-b:4,5-b']dithiophene-2,6-diyl)bis(trimethylstannane), Pd2dba3 and P(o-tol)3 were added. The mixture was degassed under vacuum and backfilled with argon before of anhydrous chlorobenzene was added. The solution was then heated and poured into methanol. The solid Polymer A was filtered and purified by Soxhlet extraction and dried overnight.

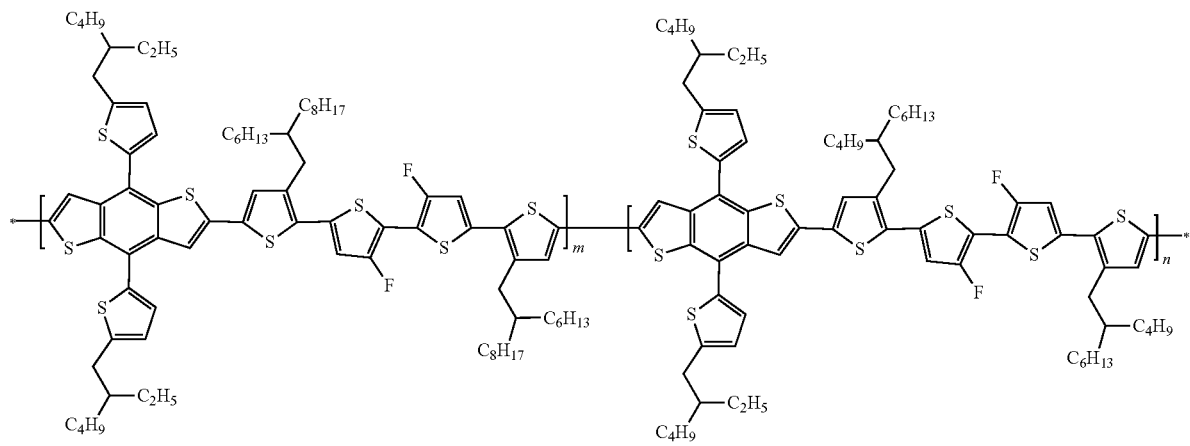

Polymer A

Polymer B Synthesis

In yet another embodiment, the polymer synthesis can be compounds 5,5'''-dibromo-3,3'''-bis(2-butyloctyl)-3'',4'-difluoro-2,2':5',2'':5'',2'''-quaterthiophene, (4,8-bis(5-(2-ethylhexyl)-thiophen-2-yl)benzo[1,2-b:4,5-b']dithiophene-2,6-diyl)bis(trimethylstannane), (4,8-bis(4-fluoro-5-(2-ethylhexyl)-thiophen-2-yl)benzo[1,2-b:4,5-b']dithiophene-2,6-diyl)bis(trimethylstannane), Pd2dba3 and P(o-tol)3 were added. The mixture was degassed under vacuum and backfilled with argon before of anhydrous chlorobenzene was added. The solution was then heated and poured into methanol. The solid Polymer B was filtered and purified by Soxhlet extraction and dried overnight.

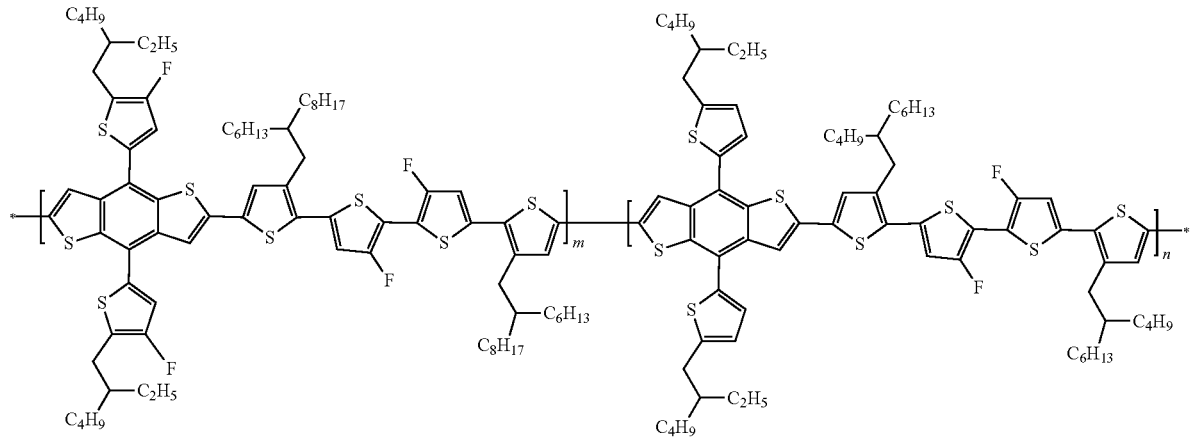

Polymer B

Polymer C Synthesis

In yet another embodiment, the polymer synthesis can be compounds 5,5'''-dibromo-3,3'''-bis(2-butyloctyl)-3'',4'-difluoro-2,2':5',2'':5'',2'''-quaterthiophene, (4,8-bis(5-(2-ethylhexyl)-thiophen-2-yl)benzo[1,2-b:4,5-b']dithiophene-2,6-diyl)bis(trimethylstannane), Pd2dba3 and P(o-tol)3 were added. The mixture was degassed under vacuum and backfilled with argon before of anhydrous chlorobenzene was added. The solution was then heated and poured into methanol. The solid Polymer C was filtered and purified by Soxhlet extraction and dried overnight.

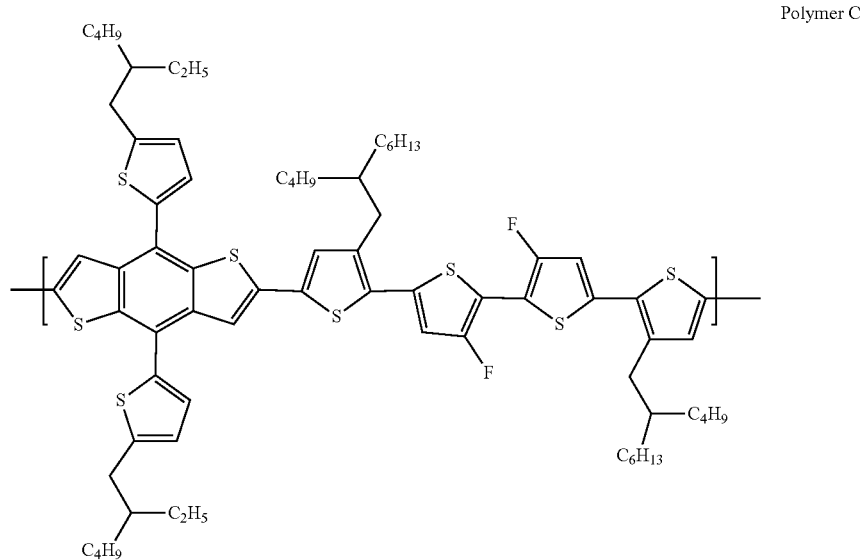

Polymer C

Polymer D Synthesis

In yet another embodiment, the polymer synthesis can be compounds 5,5'''-dibromo-3,3'''-bis(2-butyloctyl)-3'',4'-difluoro-2,2':5',2'':5'',2'''-quaterthiophene, (4,8-bis(4-chloro-5-(2-ethylhexyl)-thiophen-2-yl)benzo[1,2-b:4,5-b']dithiophene-2,6-diyl)bis(trimethylstannane), Pd2dba3 and P(o-tol)3 were added. The mixture was degassed under vacuum and backfilled with argon before of anhydrous chlorobenzene was added. The solution was then heated and poured into methanol. The solid Polymer D was filtered and purified by Soxhlet extraction and dried overnight.

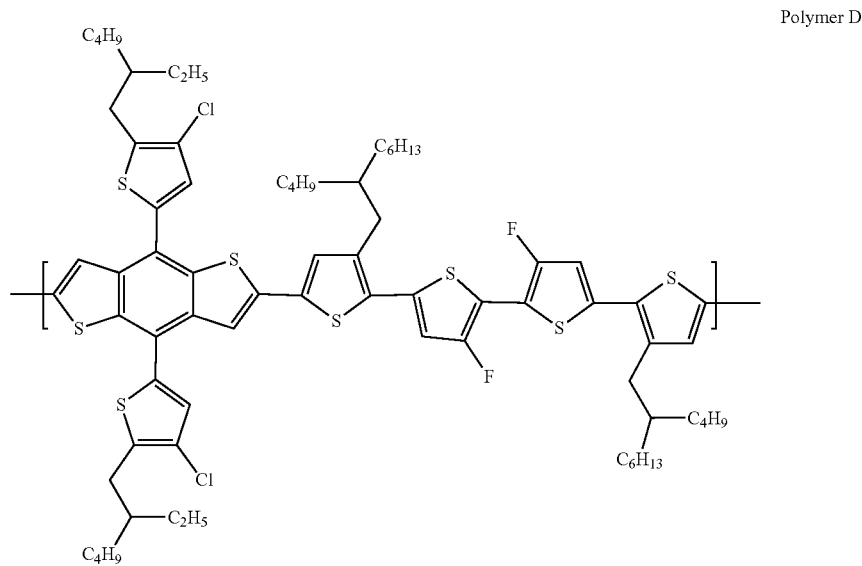

Polymer D

Anode

When used in as an organic photovoltaic device the polymer can be used in conjunction with an anode. The anode for the organic photovoltaic device can be any conventionally known anode capable of operating as an organic photovoltaic device. Examples of anodes that can be used include: indium tin oxide, aluminum, silver, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in as an organic photovoltaic device the polymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, aluminum, gold, metal nanowires.

Electron Transport Layer

When used in as an organic photovoltaic device the copolymer can be deposited onto an electron transport layer. Any commercially available electron transport layer can be used that is optimized for organic photovoltaic devices. In one embodiment the electron transport layer can comprise $(AO_x)_y BO_{(1-y)}$. In this embodiment, $(AO_x)_y$ and $BO_{(1-y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_y BO_{(1-y)}$ include: $(SnO_x)_y ZnO_{(1-y)}$, $(AlO_x)_y ZnO_{(1-y)}$, $(AlO_x)_y InO_{z(1-y)}$, $(AlO_x)_y SnO_{z(1-y)}$, $(AlO_x)_y CuO_{z(1-y)}$, $(AlO_x)_y WO_{z(1-y)}$, $(InO_x)_y ZnO_{(1-y)}$, $(InO_x)_y SnO_{z(1-y)}$, $(InO_x)_y NiO_{z(1-y)}$, $(ZnO_x)_y CuO_{z(1-y)}$, $(ZnO_x)_y NiO_{z(1-y)}$, $(ZnO_x)_y FeO_{z(1-y)}$, $(WO_x)_y VO_{z(1-y)}$, $(WO_x)_y TiO_{z(1-y)}$, and $(WO_x)_y MoO_{z(1-y)}$.

In an alternate embodiment, various fullerene dopants can be combined with $(AO_x)_y BO_{(1-y)}$ to make an electron transport layer for the organic photovoltaic device. Examples of fullerene dopants that can be combined include

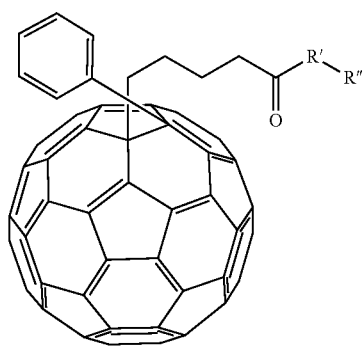

and [6,6]-phenyl-$C_{60}$-butyric-N-2-trimethylammonium ethyl ester iodide.

In the embodiment of

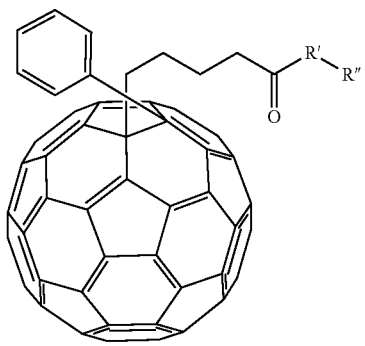

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

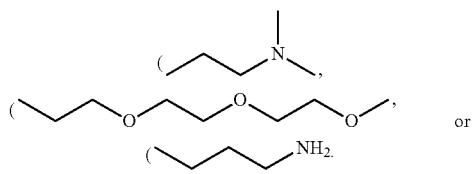

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-Co-butyric-N-2-dimethylaminoethyl ester.

Organic Photovoltaic Device Fabrication

Zinc/tin oxide (ZTO):phenyl-C60-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing $Zn(OAc)_2$ (3.98 g), $Sn(OAc)_2$ (398 mg) and PCBNOH (20.0 mg) in 2-methoxyethanol (54 mL) with ethanolamine (996 µL). Solutions were then further diluted to 65 vol % by adding more 2-methoxyethanol and stirred for at least an hour before spin casting onto indium tin oxide substrate to form the electron transport layer.

In alternate embodiments, the formation of ZTO ([6,6]-phenyl-$C_{60}$-butyric-N-2-trimethylammonium ethyl ester iodide (PCBNMI) can be used as well. One method of forming PCBNMI can be taking [6,6]-phenyl-C60-butyric-N-2-dimethylaminoethyl ester (0.05 g, 0.052 mmol) and dissolved it in dry THF (2 mL) under argon. Iodomethane (1.5 mL) was added in one portion and the vessel was sealed. The solution is then heated to 60° C. for 18 hours. The solution was cooled and opened to allow the liquids to evaporate. The solid residue was suspended in methanol, diluted with acetone, and centrifuged. This process was repeated to produce [6,6]-phenyl-C60-butyric-N-2-trimethylammonium ethyl ester iodide as a metallic green powder (0.05 g, ~99% yield).

The polymer and the acceptor, EH-IDTBR, in a ratio of 1:2 were dissolved in toluene at the concentration of 27 mg/mL to obtain the photoactive layer solution. The solution was stirred and heated at 80° C. overnight in a nitrogen filled glove box. The next day from about 0-0.5% vol % of 1,8-diiodooctane (DIO) was added before spin-coating of the photoactive layer.

Indium tin oxide patterned glass substrates were cleaned by successive ultra-sonications in acetone and isopropanol. Each 15 min step was repeated twice, and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly (vinylidene fluoride) filter and spin cast at 4000 rpm for 40 s. Films were then annealed at 170° C. for 15 min, and directly transferred into a nitrogen filled glove box.

The photoactive layer was deposited on the electron transport layer via spin coating at 1600-4000 rpm for 40 s with the solution and the substrate being preheated at 80° C. and directly transferred into a glass petri dish for to be dried.

After drying, the substrates were loaded into the vacuum evaporator where $MoO_3$ (hole transport layer) and Ag (anode) were sequentially deposited by thermal evaporation. Deposition occurred at a pressure of $<4\times10^{-6}$ torr. $MoO_3$ and Ag had thicknesses of 5.0 nm and 120 nm, respectively. Samples were then encapsulated with glass using an epoxy binder and treated with UV light for 3 min.

Photovoltaic Device Performance

TABLE 1

| Polymer | $V_{oc}$ (V) | Jsc (mA/cm$^2$) | FF (%) | PCE (%) |
|---------|------|------|-----|------|
| A | 1.03 V | 15.0 | 60% | 9.0% |
| B | 0.99 V | 14.8 | 54% | 7.9% |
| C | 1.02 V | 14.9 | 65% | 9.9% |
| D | 1.14 V | 8.0 | 49% | 4.5% |

These results indicate higher quality films with a reduction in crystallite formation are beneficial to improve the overall power conversion efficiency. Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. Fill factor percentage (FF %) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity.

Figure 12:
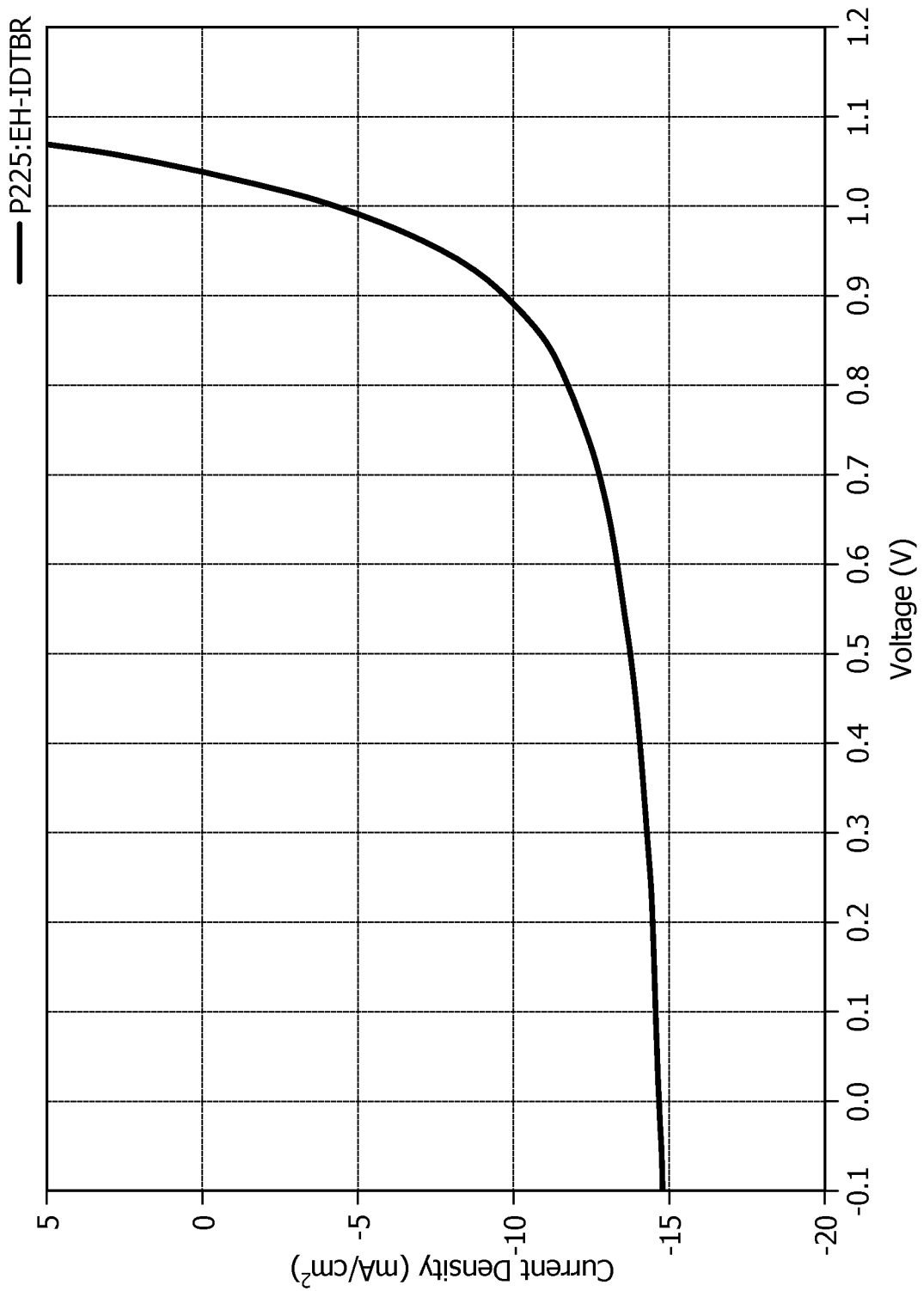
FIG. 12 depicts the current density over voltage for the Polymer A.

FIG. 12 depicts the current density over voltage for the Polymer A.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:
1. A method comprising:
combining

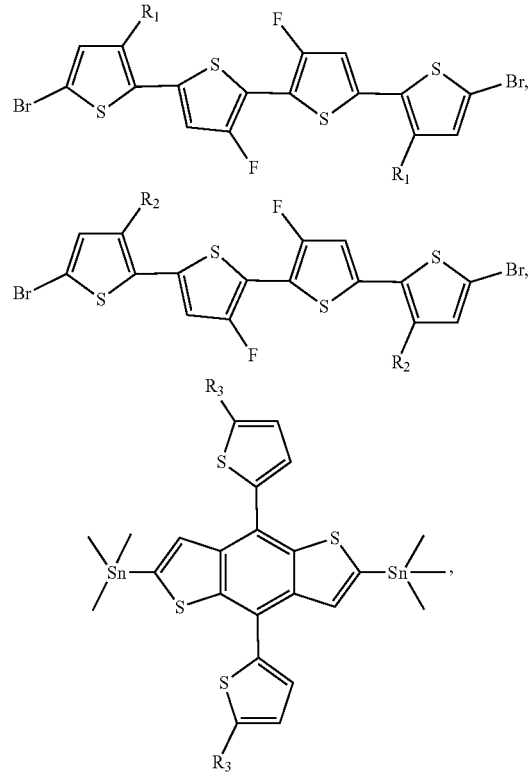

tris(dibenzylideneacetone)dipalladium(0), tris(o-tolyl) phosphine, and anhydrous chlorobenzene to produce a solution,
purifying and drying the solution to produce

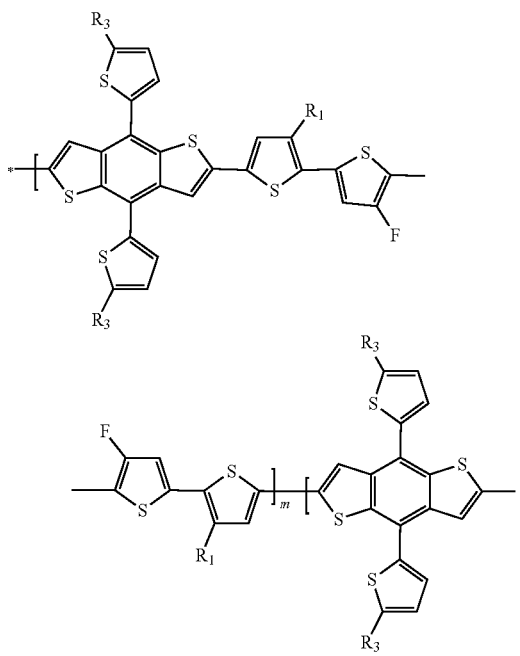

-continued

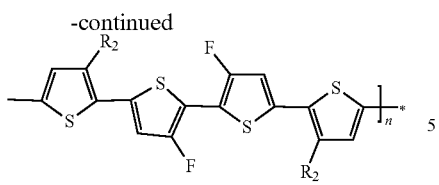

wherein n+m=1, and wherein $R_1$, $R_2$, and $R_3$ are independently selected from unsubstituted or substituted branched alkyls with 1 to 60 carbon atoms and unsubstituted or substituted linear alkyls with 1 to 60 carbon atoms.

2. A photovoltaic device comprising the copolymer of claim 1 as a photovoltaic material.

3. An electronic device comprising the copolymer of claim 1 as an active layer material.

4. The method of claim 1, wherein m ranges from about 0.3 to about 0.5 and n ranges from about 0.5 to about 0.7.

5. A copolymer made by the process of claim 1.

6. A device selected from a photovoltaic device and an electronic device comprising a copolymer made by the process of claim 1.

7. A device comprising a copolymer made by the process of claim 1, wherein the copolymer is selected from a photovoltaic material of a photovoltaic device and an active layer material of an electronic device.

* * * * *